United States Patent
Kato et al.

(10) Patent No.: US 9,358,655 B2
(45) Date of Patent: Jun. 7, 2016

(54) OUTER PERIPHERY POLISHING APPARATUS FOR DISC-SHAPED WORKPIECE

(71) Applicants: SHIN-ETSU HANDOTAI CO., LTD., Tokyo (JP); SPEEDFAM CO., LTD., Kanagawa (JP)

(72) Inventors: Tadahiro Kato, Fukushima (JP); Akitoshi Enari, Kanagawa (JP); Mitsutaka Irago, Tokyo (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 14/398,882

(22) PCT Filed: Feb. 14, 2013

(86) PCT No.: PCT/JP2013/053485
§ 371 (c)(1),
(2) Date: Nov. 4, 2014

(87) PCT Pub. No.: WO2013/168444
PCT Pub. Date: Nov. 14, 2013

(65) Prior Publication Data
US 2015/0283664 A1 Oct. 8, 2015

(30) Foreign Application Priority Data
May 7, 2012 (JP) .................................. 2012-105785

(51) Int. Cl.
  B24B 9/06 (2006.01)
  B24B 27/00 (2006.01)
  H01L 21/304 (2006.01)

(52) U.S. Cl.
CPC .............. *B24B 9/065* (2013.01); *B24B 27/0069* (2013.01); *B24B 27/0076* (2013.01); *H01L 21/304* (2013.01)

(58) Field of Classification Search
CPC .......... B24B 3/546; B24B 9/065; B24B 9/08; B24B 9/085; B24B 9/10; B24B 9/102; B24B 9/105; B24B 9/107; B24B 9/12; B24B 9/148; B24B 27/0023; B24B 27/0069; B24B 27/0076; B24B 35/00
See application file for complete search history.

(56) References Cited

U.S. PATENT DOCUMENTS 1,521,116 A * 12/1924 Miller ..................... B24B 9/14
125/11.01
4,989,373 A * 2/1991 Park ..................... B24B 41/002
451/285

(Continued)

FOREIGN PATENT DOCUMENTS

| CN | 1103511 A | 6/1995 |
| CN | 1647894 A | 8/2005 |
| CN | 101091238 A | 12/2007 |
| CN | 202088048 U | 12/2011 |

(Continued)

OTHER PUBLICATIONS

International Search Report issued in Application No. PCT/JP2013/053485, mailed Mar. 12, 2013.

(Continued)

*Primary Examiner* — Timothy V Eley
(74) *Attorney, Agent, or Firm* — Michael Best & Friedrich LLP (57) ABSTRACT

[Object] An outer periphery polishing apparatus capable of polishing the edge of workpieces having different bevel angles is to be provided.
[Solution] Edge polishing units 2A, 2B for polishing the front surface edge Ea and the rear surface edge Eb of the workpiece W each include a polishing member mounting structure 11 to which a polishing member 10 is attached, a mounting structure support unit 12 that tiltably supports the polishing member mounting structure 11, a mounting structure angle adjustment mechanism 13 that adjusts a tilt angle of the polishing member mounting structure 11, a reciprocation support base 15 that supports the mounting structure support unit 12 so as to move along a reciprocation line, a base support unit 17 that tiltably supports the reciprocation support base 15, a base angle adjustment mechanism 18 that adjusts the tilt angle of the reciprocation support base 15 so as to be parallel to the edge Eb of the workpiece W, and a pedestal 19 that supports the base support unit 17 so as to allow positional correction in a vertical direction and a horizontal direction.

14 Claims, 7 Drawing Sheets

(56) References Cited

U.S. PATENT DOCUMENTS

| | | | | |
|---|---|---|---|---|
| 5,040,342 A | * | 8/1991 | McGuire | B24B 9/107 451/38 |
| 5,074,079 A | * | 12/1991 | Park | B24B 9/107 451/11 |
| 5,265,382 A | * | 11/1993 | Park | B24B 9/10 451/44 |
| 5,327,686 A | * | 7/1994 | Park | B23Q 35/105 451/1 |
| 5,433,652 A | * | 7/1995 | Park | C03C 19/00 451/10 |
| 6,955,587 B2 | | 10/2005 | Muldowney | |
| 2008/0026185 A1 | | 1/2008 | Mizushima | |
| 2011/0256815 A1 | | 10/2011 | Mizushima | |
| 2012/0100785 A1 | * | 4/2012 | Ishimasa | H01L 21/02021 451/41 |

FOREIGN PATENT DOCUMENTS

| | | |
|---|---|---|
| CN | 102355982 A | 2/2012 |
| JP | H11-221744 A | 8/1999 |
| JP | 2002-137155 A | 5/2002 |
| JP | 2002-144201 A | 5/2002 |
| JP | 2002-307276 A | 10/2002 |
| JP | 2003-145399 A | 5/2003 |
| JP | 2004-154880 A | 6/2004 |
| JP | 2005-026274 A | 1/2005 |
| JP | 2009-018364 A | 1/2009 |
| JP | 2009-297842 A | 12/2009 |

OTHER PUBLICATIONS

Office Action issued in Chinese Application No. 201380023886.5, dated Dec. 31, 2015.

* cited by examiner

OUTER PERIPHERY POLISHING APPARATUS FOR DISC-SHAPED WORKPIECE

TECHNICAL FIELD

The present invention relates to an outer periphery polishing apparatus for polishing a sloped edge formed on an outer periphery of the front surface and the rear surface of a disk-shaped workpiece.

BACKGROUND ART

Figure 7:
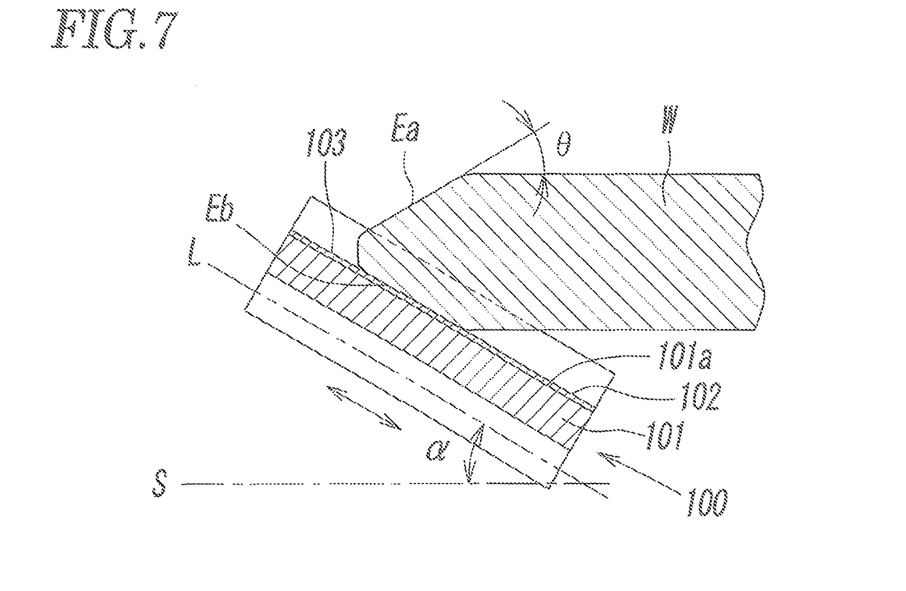
FIG. 7 is an enlarged cross-sectional view showing a polishing process of a rear surface edge of a workpiece, performed by a conventional outer periphery polishing apparatus.

A semiconductor wafer (hereinafter, workpiece) W, an example of disk-shaped workpieces includes, as shown in FIG. 7 in an enlarged scale, sloped edges Ea, Eb each formed by chamfering the outer peripheral edge of the front surface and the rear surface, and such edges Ea, Eb are polished by an outer periphery polishing apparatus. Patent Literature (PTL) 1 discloses the outer periphery polishing apparatus for polishing such edges.

Figure 8:
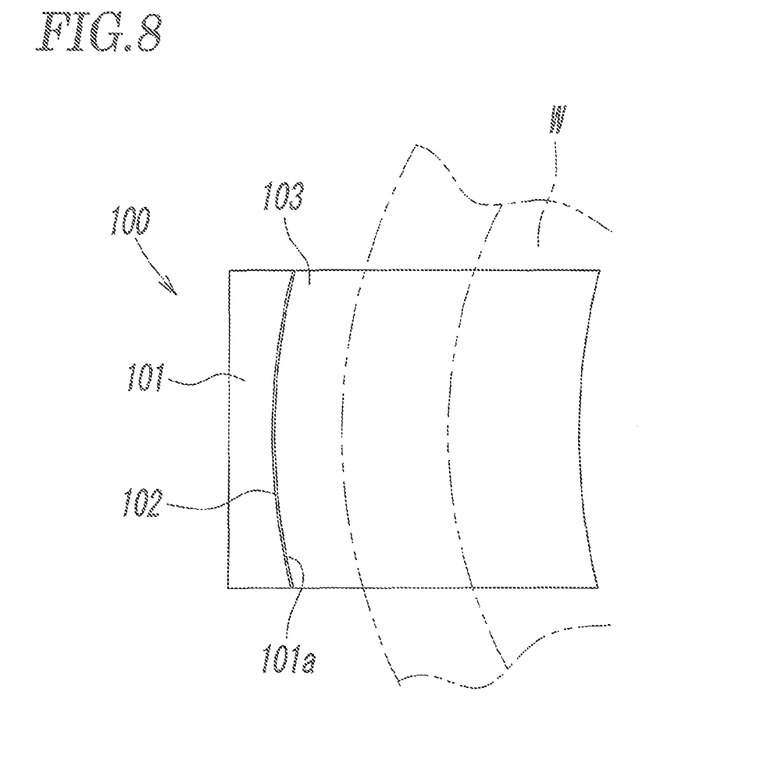
FIG. 8 is a plan view of FIG. 7.

As shown in FIG. 7 and FIG. 8 schematically illustrating the case of polishing the edge Eb on the rear surface side, the outer periphery polishing apparatus includes a polishing member 100 formed by attaching a polishing pad 102 onto an arcuate pad attaching surface 101a of a pad holder 101. An arcuate working surface 103 formed of the polishing pad 102 is tilted to be parallel to the edge Eb and brought into surface-to-surface contact with the edge Eb, and the workpiece W is made to rotate about a vertical axial line while maintaining the surface-to-surface contact, to thereby polish the edge Eb with the working surface 103. At this moment the polishing member 100 is made to slowly reciprocate by a non-illustrated reciprocation mechanism along a straight line (reciprocation line L) parallel to the edge Eb, so that the entirety of the working surface 103 is utilized for polishing the edge Eb.

The outer periphery polishing apparatus is configured to polish the edge Eb of the workpiece W maintaining the arcuate working surface 103 of the polishing member 100 in surface-to-surface contact with the edge Eb as mentioned above, and hence provides excellent polishing efficiency. However, a tilt angle α of the working surface 103 and the reciprocation line L with respect to a horizontal plane S is fixed to a predetermined angle, and therefore only such workpieces having a bevel angle θ (angle between edge and front surface or rear surface of the workpiece) equal to the tilt angle α can be polished, which is an aspect to be improved. The bevel angle of the edge is not the same but varies in each of the workpieces, and therefore there has been a demand for a mechanism to adjust the tilt angle α of the working surface 103 and the reciprocation line L to the bevel angle of the workpiece, so as to polish the workpieces having different bevel angles.

On the other hand, PTL 2 and PTL 3 disclose a polishing apparatus configured to relatively tilt the polishing element with respect to the workpiece, so as to polish the entirety of the edge by adjusting the contact angle of the polishing element with respect to the workpiece.

However, the cited polishing apparatus is configured to polish the edge while gradually changing the contact angle of the polishing element with respect to the workpiece, and therefore the configuration and working are fundamentally different from those of the outer periphery polishing apparatus according to PTL 1. Accordingly, the technique according to PTL 2 and PTL 3 is unable to be applied as it is to the outer periphery polishing apparatus.

CITATION LIST

Patent Literature

PTL 1: Japanese Unexamined Patent Application Publication No. 2002-144201
PTL 2: Japanese Unexamined Patent Application Publication No. 2004-154880
PTL 3: Japanese Unexamined Patent Application Publication No. 2009-297842

SUMMARY OF INVENTION

Technical Problem

An object of the present invention is to provide an outer periphery polishing apparatus in which a working surface of a polishing member is disposed parallel to an edge of a workpiece so as to make surface-to-surface contact with the edge, and the polishing member is made to reciprocate along a reciprocation line parallel to the edge while maintaining the surface-to-surface contact thus to polish the edge, the outer periphery polishing apparatus being configured to adjust a tilt angle of the working surface and the reciprocation line to a bevel angle of the workpiece, to thereby polish workpieces having different bevel angles.

Solution to Problem

To achieve the foregoing object, the present invention provides an outer periphery polishing apparatus including a chucking device configured to retain a disk-shaped workpiece and rotate the workpiece about an axial line, and a front surface edge polishing unit and a rear surface edge polishing unit each including a polishing member having an arcuate working surface and respectively configured to polish an edge of the front surface and the rear surface of the workpiece.

The edge polishing units each include a polishing member mounting structure to which the polishing member is replaceably attached, a mounting structure support unit that tiltably supports the polishing member mounting structure, a mounting structure angle adjustment mechanism that adjusts a tilt angle of the polishing member mounting structure such that the working surface of the polishing member becomes parallel to the edge of the workpiece, a load applying device that presses the working surface of the polishing member against the edge of the workpiece thereby applying a polishing load, a reciprocation support base that supports the mounting structure support unit so as to move along a straight line (reciprocation line) inclined with respect to the axial line, a reciprocation mechanism that causes the mounting structure support unit to reciprocate along the straight line, a base support unit that tiltably supports the reciprocation support base, a base angle adjustment mechanism that adjusts a tilt angle of the reciprocation support base such that the straight line becomes parallel to the edge of the workpiece, and a pedestal that supports the base support unit so as to allow positional correction in a vertical direction and a horizontal direction.

In the present invention, it is preferable that the polishing member is formed such that a working surface angle defined by the working surface of the polishing member with respect to a reference surface becomes equal to a bevel angle of the workpiece, so that the working surface becomes parallel to the edge of the workpiece upon attaching the polishing member to the polishing member mounting structure and setting the reference surface to a horizontal orientation.

In the present invention, it is preferable that the polishing member mounting structure is supported by the mounting structure support unit so as to tilt about a first pivotal shaft orthogonal to the axial line of the workpiece, and the reciprocation support base is supported by the base support unit so as to tilt about a second pivotal shaft parallel to the first pivotal shaft.

In this case, it is preferable that the mounting structure support unit includes a reciprocation-slide base supported by the reciprocation support base so as to move along the straight line, and a sliding member supported by the reciprocation-slide base so as to move in a direction orthogonal to the straight line, and that the sliding member is connected to the load applying device and the polishing member mounting structure is supported by the sliding member.

In the present invention, it is preferable that the pedestal includes a first pedestal located at a predetermined position, a second pedestal supported by the first pedestal so as to move in a horizontal direction and supporting the base support unit so as to move in a vertical direction, a horizontal position correction mechanism that corrects a position of the second pedestal in the horizontal direction, and a vertical position correction mechanism that corrects a position of the base support unit with respect to the second pedestal in the vertical direction.

Advantageous Effects of Invention

The outer periphery polishing apparatus according to the present invention is configured to adjust the tilt angle of the reciprocation support base that causes the polishing member to reciprocate along the reciprocation line parallel to the edge of the workpiece such that the reciprocation line becomes parallel to the edge of the workpiece, and to adjust the tilt angle of the polishing member mounting structure to which the polishing member is attached such that the working surface of the polishing member becomes parallel to the edge of the workpiece. Therefore, the edges of workpieces having different bevel angles can be polished with a single polishing apparatus.

DESCRIPTION OF EMBODIMENTS

Hereafter, an embodiment of an outer periphery polishing apparatus for disk-shaped workpiece according to the present invention will be described in details, with reference to the drawings.

Figure 1:
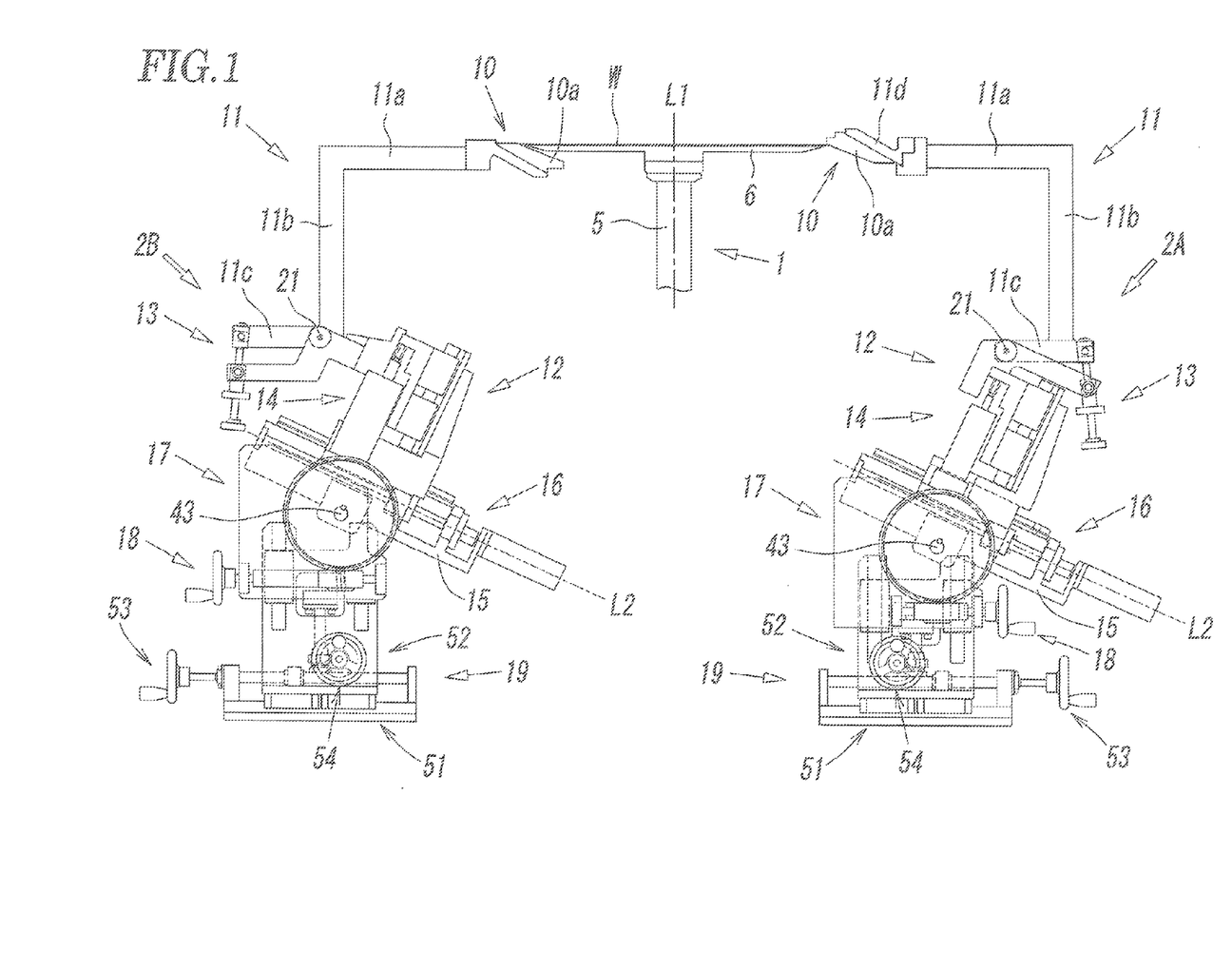
FIG. 1 is a front view of an outer periphery polishing apparatus according to the present invention, in which a part of a chucking device is unillustrated.

The outer periphery polishing apparatus shown in FIG. 1 is configured to polish sloped edges Ea, Eb (see FIG. 4) formed along the outer peripheral edge of the front and rear surfaces of a disk-shaped workpiece W such as a semiconductor wafer, and includes a chucking device 1 that retains the workpiece W in a horizontal position and rotates the workpiece W about a vertical axial line L1, a front surface edge polishing unit 2A that polishes the edge Ea on the front surface (upper face) of the workpiece W, and a rear surface edge polishing unit 2B that polishes the edge Eb on the rear surface (lower face) of the workpiece W. FIG. 1 illustrates the edge polishing units 2A, 2B in a polishing operation of the edges Ea, Eb.

The chucking device 1 includes a chuck table 6 provided at the top of a vertically oriented main shaft 5 and having a disk shape slightly smaller in diameter than the workpiece W. The workpiece W is horizontally retained on the chuck table 6 by vacuum adsorption or the like, with the outer peripheral portion laterally sticking out from the chuck table 6. Accordingly, the chuck table 6 includes a plurality of adsorption holes formed in the upper face, and the adsorption holes communicate with a non-illustrated vacuum pump through a flow path provided inside the main shaft 5. In addition, the main shaft 5 is connected to a non-illustrated motor, to be driven to rotate in a forward and reverse direction at a predetermined speed.

To retain the workpiece W on the chuck table 6, an electrostatic chuck based on electrostatic adsorption or other desired methods may be adopted, instead of the vacuum adsorption.

The front surface edge polishing unit 2A and the rear surface edge polishing unit 2B are located so as to oppose each other across the axial line L1 of the workpiece W. Although the pair of edge polishing units 2A, 2B are not configured in exactly the same way, the configuration and the function of these units are substantially the same except for minor differences in shape or orientation of some parts. Accordingly, the description given hereunder will be focused on the rear surface edge polishing unit 2B for the sake of simplicity, and brief description will subsequently follow about the differences of the front surface edge polishing unit 2A with respect to the rear surface edge polishing unit 2B.

Figure 2:
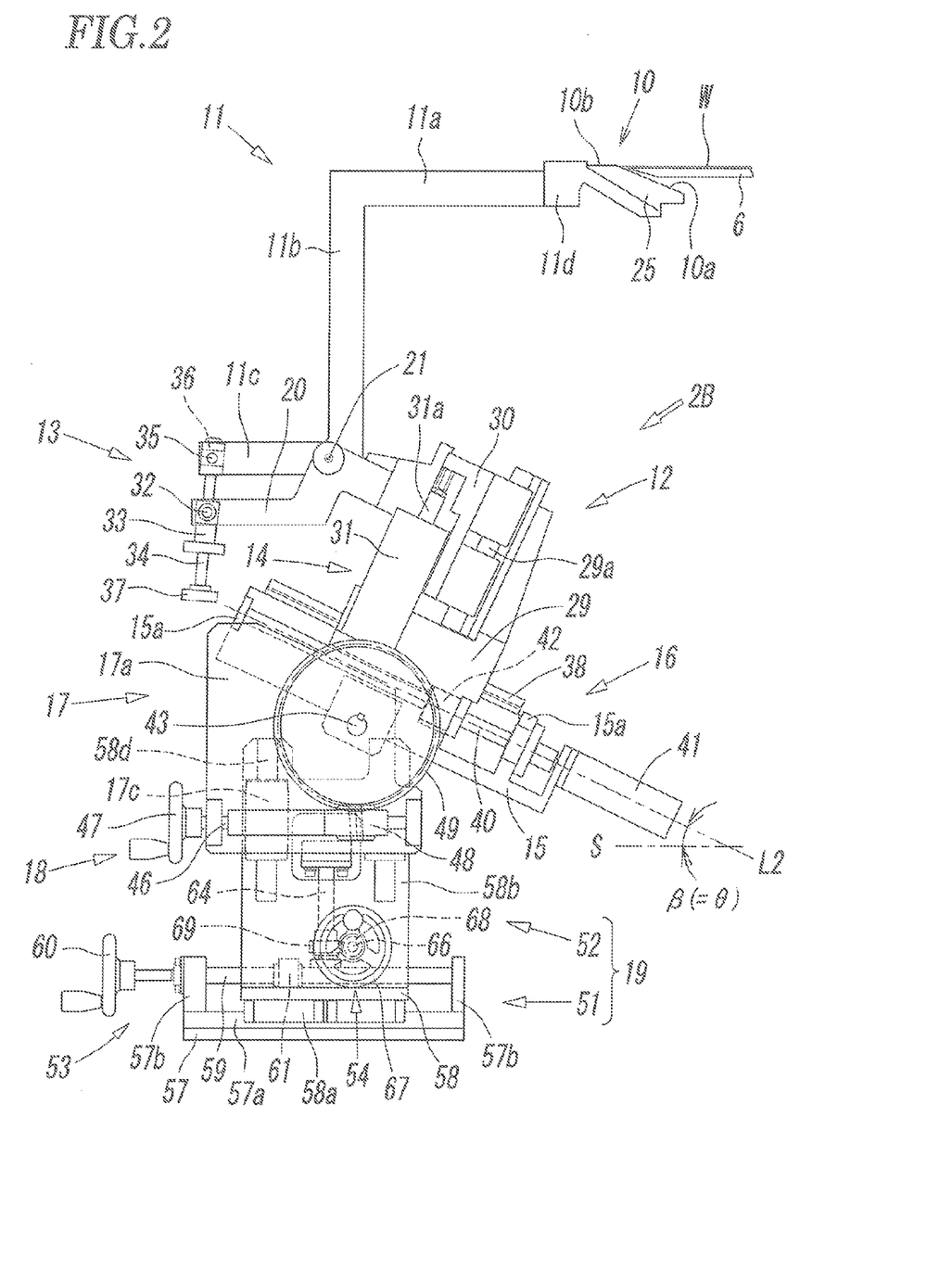
FIG. 2 is an enlarged front view of a rear surface edge polishing unit.
Figure 3:
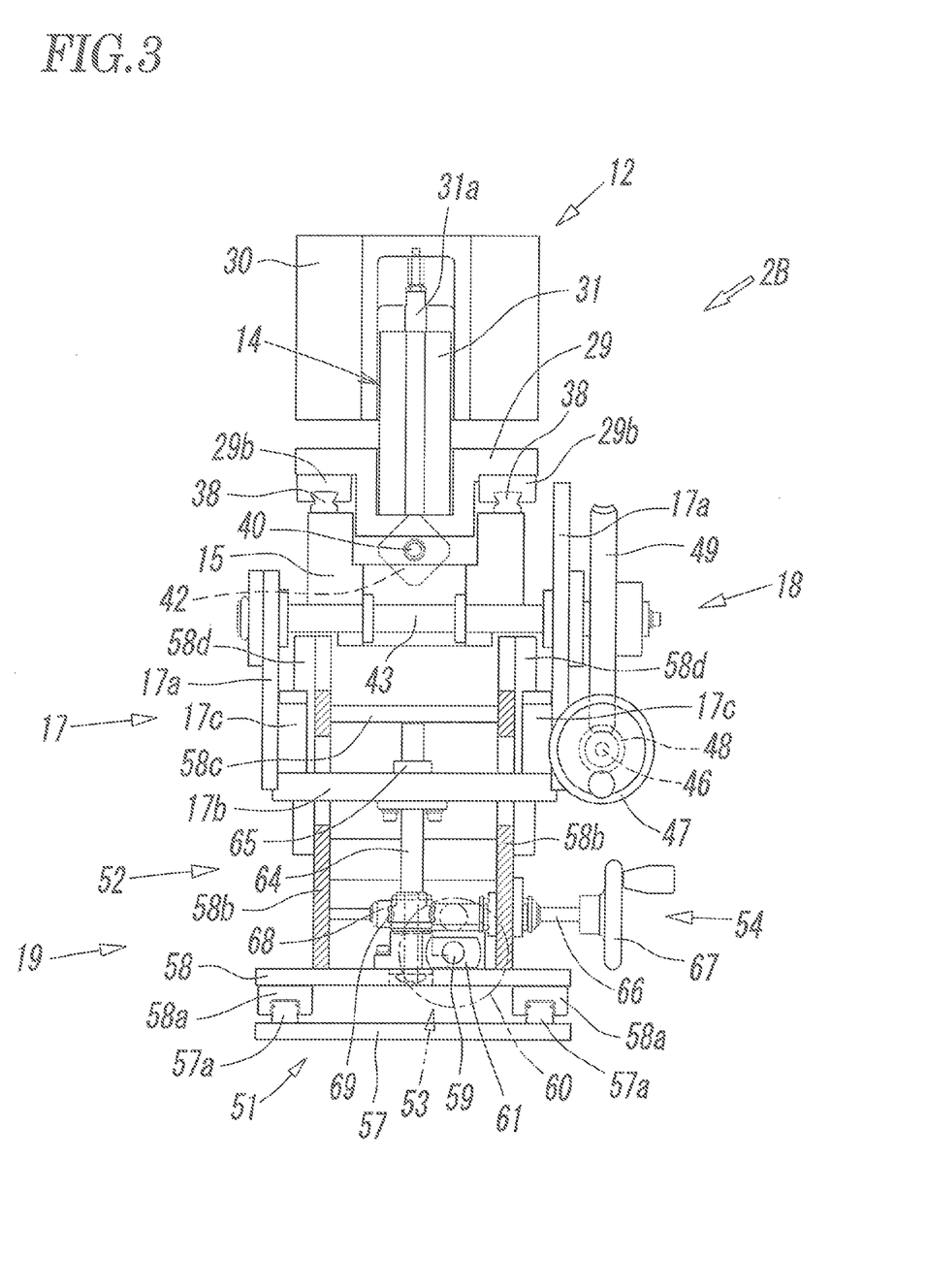
FIG. 3 is a partially cut-away side view of the rear surface edge polishing unit shown in FIG. 2, seen from the left.

As shown in FIG. 2 and FIG. 3, the rear surface edge polishing unit 2B includes a polishing member mounting structure 11 to which a polishing member 10 is replaceably attached, a mounting structure support unit 12 that tiltably supports the polishing member mounting structure 11, a mounting structure angle adjustment mechanism 13 that adjusts a tilt angle of the polishing member mounting structure 11 such that a working surface 10a of the polishing member 10 becomes parallel to the edge Eb of the workpiece W, a load applying device 14 that presses the working surface 10a of the polishing member 10 against the edge Eb of the workpiece W to thereby apply a polishing load to the edge Eb, a reciprocation support base 15 that supports the mounting structure support unit 12 so as to move along a straight line (reciprocation line) L2 inclined with respect to the axial line L1, a reciprocation mechanism 16 that causes the mounting structure support unit 12 to reciprocate along the reciprocation line L2, a base support unit 17 that tiltably supports the reciprocation support base 15, a base angle adjustment mechanism 18 that adjusts the tilt angle of the reciprocation support base 15 such that the reciprocation line L2 becomes parallel to the edge Eb of the workpiece W, and a pedestal 19 that supports the base support unit 17 so as to allow positional correction in a vertical direction and a horizontal direction.

The polishing member mounting structure 11 includes a transverse arm portion 11a extending laterally, preferably horizontally, to the outer periphery of the workpiece W, a vertical arm portion 11b extending downward, preferably vertically downward from the base portion of the transverse arm portion 11a, and an adjusting arm portion 11c extending laterally, preferably horizontally, from the lower end portion of the vertical arm portion 11b. The polishing member mounting structure 11 is supported at the position corresponding to the adjusting arm portion 11c by a bracket 20 extending from the mounting structure support unit 12, so as to tilt about a first pivotal shaft 21 orthogonal to the axial line L1, and the polishing member 10 is replaceably attached to a polishing member mounting head 11d provided at the distal end portion of the transverse arm portion 11a.

Figure 4:
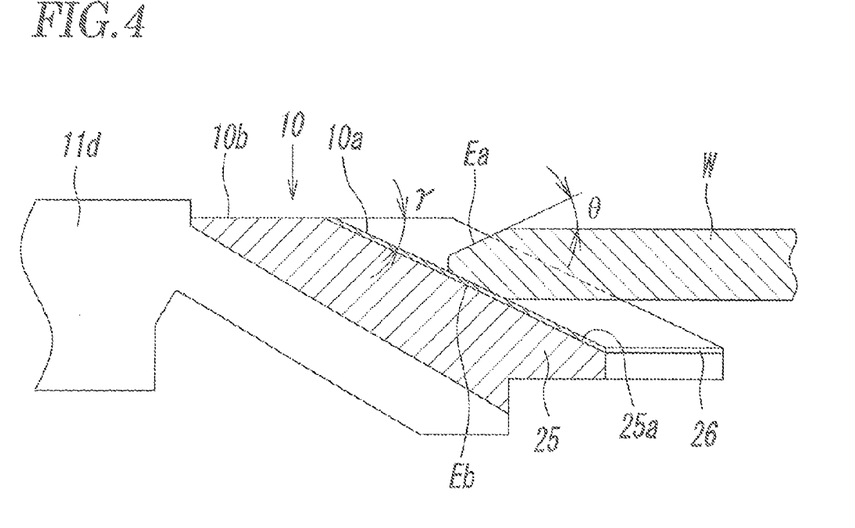
FIG. 4 is an enlarged cross-sectional view of FIG. 2 focusing on a polishing member, showing a workpiece in a further enlarged scale.

As is apparent from FIG. 4, the polishing member 10 is formed by adhering an elastic sheet-shaped polishing pad 26 bent into an arcuate shape onto an arcuate pad attaching surface 25a of a pad holder 25 formed of a hard material such as a synthetic resin, a metal, or a ceramic, and the surface of the polishing pad 26 constitutes the working surface 10a curved in the arcuate shape for polishing the edge Eb of the workpiece W. The polishing member 10 thus configured is removably mounted on the polishing member mounting head 11d such that the working surface 10a is tilted with respect to the horizontal plane by an angle equal to a bevel angle θ of the edge Eb, in other words such that the working surface 10a becomes parallel to the edge Eb, when the polishing of the workpiece W is performed.

In the mentioned configuration, it is preferable to set the polishing member 10 such that an angle (working surface angle) γ defined between the working surface 10a and a flat reference surface 10b formed at a predetermined position on the upper face or lower face of the polishing member 10 becomes equal to the bevel angle θ, and such that the reference surface 10b of the polishing member 10 is horizontally oriented when the polishing member mounting head 11d is set to the polishing position. In this case, the working surface 10a can be set parallel to the edge Eb, by mounting the polishing member 10 on the polishing member mounting head 11d and adjusting the tilt angle of the polishing member mounting structure 11 such that the reference surface 10b of the polishing member 10 becomes horizontal.

The working surface 10a may include a plurality of slurry grooves for facilitating the polishing slurry to smoothly flow.

The mounting structure support unit 12 includes a reciprocation-slide base 29 supported by the reciprocation support base 15 so as to move along the reciprocation line L2, and a sliding member 30 supported by the reciprocation-slide base 29 so as to move along a guide 29a in a direction orthogonal to the reciprocation line L2, and the bracket 20 sticks out from the sliding member 30.

A cylinder 31 is fixed to the reciprocation-slide base 29, and a rod 31a of the cylinder 31 extends parallel to the guide 29a. The end portion of the rod 31a is connected to the sliding member 30, so that the extending or receding motion of the rod 31a causes the sliding member 30 to move up or downward in a direction orthogonal to the edge Eb of the workpiece W. When the sliding member 30 is displaced upward the working surface 10a of the polishing member 10 is made to abut and pressed against the edge Eb of the workpiece W, and a polishing load according to a pneumatic pressure supplied to the cylinder 31 is applied to the polishing member 10.

Accordingly, the cylinder 31 constitutes the load applying device 14 for applying a predetermined polishing load to the polishing member 10. Here, although the movement of the polishing member 10 to and from the workpiece W and the applying of the polishing load are both realized by the cylinder 31 in this embodiment, another cylinder exclusively for moving the polishing member 10 to and from the workpiece W may be additionally provided.

The mounting structure angle adjustment mechanism 13 includes a cylindrical clamp nut 33 attached to the distal end portion of the bracket 20 so as to tilt about a first support shaft 32 parallel to the first pivotal shaft 21, a bar-shaped adjusting screw 34 screw-engaged with the clamp nut 33 so as to move closer thereto or away therefrom, and a stopper 36 attached to the adjusting arm portion 11c so as to tilt about a second support shaft 35 parallel to the first support shaft 32, and the tip portion of the adjusting screw 34 is blocked by the stopper 36, so as to relatively rotate with respect to each other but to be fixed to each other in the axial direction of the adjusting screw 34. Upon operating a handle 37 so as to rotate the adjusting screw 34 in a forward or reverse direction, the adjusting screw 34 is made to move forward or backward so as to change the angle (distance) between the adjusting arm portion 11c and the bracket 20, and the polishing member mounting structure 11 is made to tilt about the first pivotal shaft 21. Thus, the tilt angle of the polishing member mounting structure 11 can be adjusted. Accordingly, when the working surface 10a of the polishing member 10 is not parallel to the edge Eb of the workpiece W, the working surface 10a can be oriented parallel to the edge Eb by adjusting the tilt angle of the polishing member mounting structure 11 with the mounting structure angle adjustment mechanism 13.

Whether the working surface 10a is parallel to the edge Eb can be confirmed using a detector such as a level. To be more detailed, the polishing member 10 is set in advance such that the tilt angle of the working surface 10a becomes equal to the bevel angle, i.e., the working surface 10a becomes parallel to the edge Eb, when the reference surface 10b is oriented horizontal. Then the tilt angle of the polishing member mounting structure 11 is adjusted as above so that the detector placed on the reference surface 10b of the polishing member 10 indicates the horizontality. Alternatively, another reference surface, for example formed on the upper face of the polishing member mounting head 11d, may be employed, instead of the reference surface 10b of the polishing member 10.

A left-and-right pair of guide rails 38 are provided on the upper face of the reciprocation support base 15 in order to support the reciprocation-slide base 29, and a pair of sliding portions 29b on the lower face of the reciprocation-slide base 29 are mounted on the respective guide rails 38, so that the reciprocation-slide base 29 can move along the guide rails 38 via the sliding portions 29b. The guide rails 38 are parallel to each other and also parallel to the reciprocation line L2.

The reciprocation mechanism 16 includes a reciprocation ball screw 40 having the tip portion and the base portion rotatably supported by a bearing 15a provided in the reciprocation support base 15, a reciprocation motor 41 that drives the reciprocation ball screw 40 to rotate in both forward and reverse directions, and a reciprocation nut 42 screw-engaged with the reciprocation ball screw 40. The reciprocation ball screw 40 is parallel to the reciprocation line L2, the reciprocation motor 41 is mounted on the reciprocation support base 15, and the reciprocation nut 42 is attached to the reciprocation-slide base 29. Upon activating the reciprocation motor 41 to rotate the reciprocation ball screw 40 in the forward or reverse direction, the reciprocation nut 42 is caused to move along the reciprocation ball screw 40, so that the entirety of the mounting structure support unit 12 reciprocates along the reciprocation line L2.

The base support unit 17 includes a left-and-right pair of vertical frame members 17a, and a transverse frame member 17b connecting the left and right vertical frame members 17a together. The left and right vertical frame members 17a serve to rotatably support a second pivotal shaft 43 parallel to the first pivotal shaft 21, and the reciprocation support base 15 is fixed to the second pivotal shaft 43.

The base angle adjustment mechanism 18 includes a horizontal worm shaft 46 horizontally supported by the outer face of one of the left and right vertical frame members 17a, the handle 47 for rotating operation attached to an end portion of the horizontal worm shaft 46, a worm 48 provided in the vicinity of the other end portion of the horizontal worm shaft 46, and a worm wheel 49 fixed to an end portion of the second pivotal shaft 43 and meshed with the worm 48. Upon operating the handle 47 to rotate the horizontal worm shaft 46, the worm wheel 49 is made to rotate by the worm 48 so that the second pivotal shaft 43 is made to rotate. Accordingly, the reciprocation support base 15 is tilted, and thus a tilt angle $\beta$ of the reciprocation ball screw 40 with respect to the horizontal plane S, i.e., the tilt angle of the reciprocation line L2 can be adjusted to a desired angle.

Whether the tilt angle $\beta$ of the reciprocation line L2 is set to the desired angle can be confirmed using a detector such as a digital protractor. To be more detailed, a measurement surface parallel to the reciprocation line L2 is formed on the reciprocation support base 15 and a horizontal reference surface is formed on the base support unit 17 in advance. Then the detector is placed at the intersection of the reference surface and the measurement surface, so as to adjust the tilt angle of the reciprocation support base 15 while monitoring the detector, to check whether the tilt angle of the measurement surface with respect to the reference surface matches the desired angle.

The pedestal 19 includes a first pedestal 51 located at a predetermined position in the polishing apparatus, and a second pedestal 52 supported by the first pedestal 51 so as to move in the horizontal direction, the second pedestal 52 supporting the base support unit 17 so as to move in the vertical direction. In addition, the pedestal 19 includes a horizontal position correction mechanism 53 that corrects the position of the second pedestal 52 in the horizontal direction and a vertical position correction mechanism 54 that corrects the position of the base support unit 17 with respect to the second pedestal 52 in the vertical direction. Further details of the configuration of the pedestal 19 will be described hereunder.

The first pedestal 51 includes a fixed plate 57 fixed to the floor, and a pair of guide rails 57a are respectively mounted on the left and right end portions of the upper face of the fixed plate 57, the guide rails 57a being parallel to each other and horizontally oriented. A pair of sliding portions 58a, respectively formed on the left and right end portions of the lower face of the movable plate 58 of the second pedestal 52, are placed on the respective guide rails 57a, so that the second pedestal 52 can move in the horizontal direction along the guide rail 57a via the sliding portions 58a.

Further, a pair of bearings 57b are provided on the upper face of the fixed plate 57 so as to rotatably support the horizontal ball screw 59, and a handle 60 for rotating operation is mounted at an end portion of the horizontal ball screw 59. On the upper face of the movable plate 58 a nut 61 is fixed, the nut 61 being screw-engaged with the horizontal ball screw 59. Accordingly, upon operating the handle 60 to rotate the horizontal ball screw 59, the nut 61 is caused to move along the horizontal ball screw 59, so that the position of the second pedestal 52 in the horizontal direction can be corrected. Thus, the horizontal ball screw 59, the handle 60, and the nut 61 constitute the horizontal position correction mechanism 53. The horizontal position correction mechanism 53 serves to move the polishing member 10 in the horizontal direction toward and away from the chucking device 1. With this mechanism, the position of the second pedestal 52 in the horizontal direction after the foregoing angle adjustment can be micro-adjusted.

The second pedestal 52 includes a left-and-right pair of vertical guide frames 58b vertically erected from the movable plate 58, and a transverse connection frame 58c horizontally oriented and connecting the left and right vertical guide frames 58b together in the vicinity of the upper end portion of the vertical guide frames 58b. A guide 58d is provided so as to vertically extend on the outer surface of each of the left and right vertical guide frames 58b, and a sliding member 17c formed on the vertical frame member 17a of the base support unit 17 is fitted to the guide 58d from the outer side, so that the second pedestal 52 can move in the vertical direction along the guide 58d via the sliding member 17c. In this embodiment, two of such guides 58d are provided on each of the left and right vertical guide frames 58b, and therefore two of the sliding members 17c are provided on each of the left and right vertical frame members 17a.

A vertical ball screw 64 is disposed on the second pedestal 52 in the vertical direction, with the upper and lower end portions rotatably supported by the movable plate 58 and the transverse connection frame 58c, respectively, and a nut 65 screw-engaged with the vertical ball screw 64 is fixed to the transverse frame member 17b of the base support unit 17. When the vertical ball screw 64 is made to rotate in the forward or reverse direction the nut 65 is caused to move up or downward along the vertical ball screw 64, and thus the position of the base support unit 17 in the vertical direction can be corrected.

To rotate the vertical ball screw 64, a horizontal worm shaft 66, having a handle 67 for rotating operation on an end portion, is rotatably supported by the left and right vertical guide frames 58b of the second pedestal 52, and a worm 68 attached to the horizontal worm shaft 66 and a worm wheel 69 attached to the vertical ball screw 64 are meshed with each other. Upon operating the handle 67 so as to rotate the horizontal worm shaft 66 in the forward or reverse direction, the vertical ball screw 64 is caused to rotate in the forward or reverse direction via the worm 68 and the worm wheel 69. Thus, the handle 67, the horizontal worm shaft 66, the worm 68, the worm wheel 69, the vertical ball screw 64, and the nut 65 constitute the vertical position correction mechanism 54 that corrects the position of the base support unit 17 in the vertical direction. The vertical position correction mechanism 54 serves to move the polishing member 10 in the vertical direction toward and away from the chucking device 1. With this mechanism, the position of the base support unit 17 in the vertical direction after the foregoing angle adjustment can be micro-adjusted.

Hereunder, description will be given about the polishing operation performed by the rear surface edge polishing unit 2B configured as above with respect to the edge Eb on the rear surface of the workpiece W. When the bevel angle of the edge Eb is $\theta$, a polishing member having a working surface angle $\gamma$ that is equal to $\theta$ is employed as the polishing member 10. In addition, the tilt angle $\beta$ of the reciprocation support base 15 is adjusted to the angle equal to $\theta$, so that the reciprocation line L2 is oriented parallel to the edge Eb, and the tilt angle of the polishing member mounting structure 11 is also adjusted such that the working surface 10a becomes parallel to the edge Eb.

After setting the workpiece W on the chuck table 6 of the chucking device 1, the working surface 10a of the polishing member 10 is brought into contact with the edge Eb on the rear surface by using the load applying device 14, and the workpiece W is made to rotate about the axial line L1 to thereby polish the edge Eb with the working surface 10a. At this point, a predetermined polishing load is applied to the polishing member 10 by the load applying device 14. Further, when the reciprocation motor 41 of the reciprocation mechanism 16 drives the reciprocation ball screw 40 in the forward or reverse direction the reciprocation nut 42 is caused to reciprocate along the reciprocation ball screw 40, the polishing member 10 is caused to slowly reciprocate along the reciprocation line L2 via the mounting structure support unit 12 and the polishing member mounting structure 11, so that the contact position between the working surface 10a and the edge Eb is shifted.

When the polishing is finished, the polishing member 10 is moved away from the workpiece W by the load applying device 14, and the workpiece W is released from the chuck table 6.

The edge polishing unit 2B is also capable of polishing another workpiece W having a different bevel angle of the edge Eb. To polish the workpiece W having a bevel angle of $\theta 1$, the polishing member 10 is replaced with another one having a working surface angle $\gamma$ (see FIG. 4) that is equal to $\theta 1$. In addition, the tilt angle $\beta$ of the reciprocation support base 15, i.e., the reciprocation line L2 is adjusted by the base angle adjustment mechanism 18 so as to become equal to $\theta 1$.

A reason of replacing the polishing member 10 is that, in the polishing member having the working surface angle $\gamma$ that is equal to $\theta$, the cross-sectional shape of the arcuate working surface 10a is configured so as to make surface-to-surface contact with the edge when the polishing member 10 is oriented parallel to the edge having the bevel angle of $\theta$, and therefore such a working surface 10a is unable to make surface-to-surface contact with the edge having the bevel angle of $\theta 1$ despite the polishing member 10 being oriented parallel thereto. For this reason, the polishing member is replaced with another one having a working surface angle that is equal to the bevel angle of the workpiece to be polished.

To adjust the tilt angle $\beta$ of the reciprocation line L2, the handle 47 of the base angle adjustment mechanism 18 is operated so as to rotate the horizontal worm shaft 46. Accordingly, the second pivotal shaft 43 is made to rotate by a predetermined angle via the worm 48 and the worm wheel 49 so that the reciprocation support base 15 is tilted, and thus the tilt angle $\beta$ of the reciprocation ball screw 40 can be set to be equal to $\theta 1$.

Figure 5:
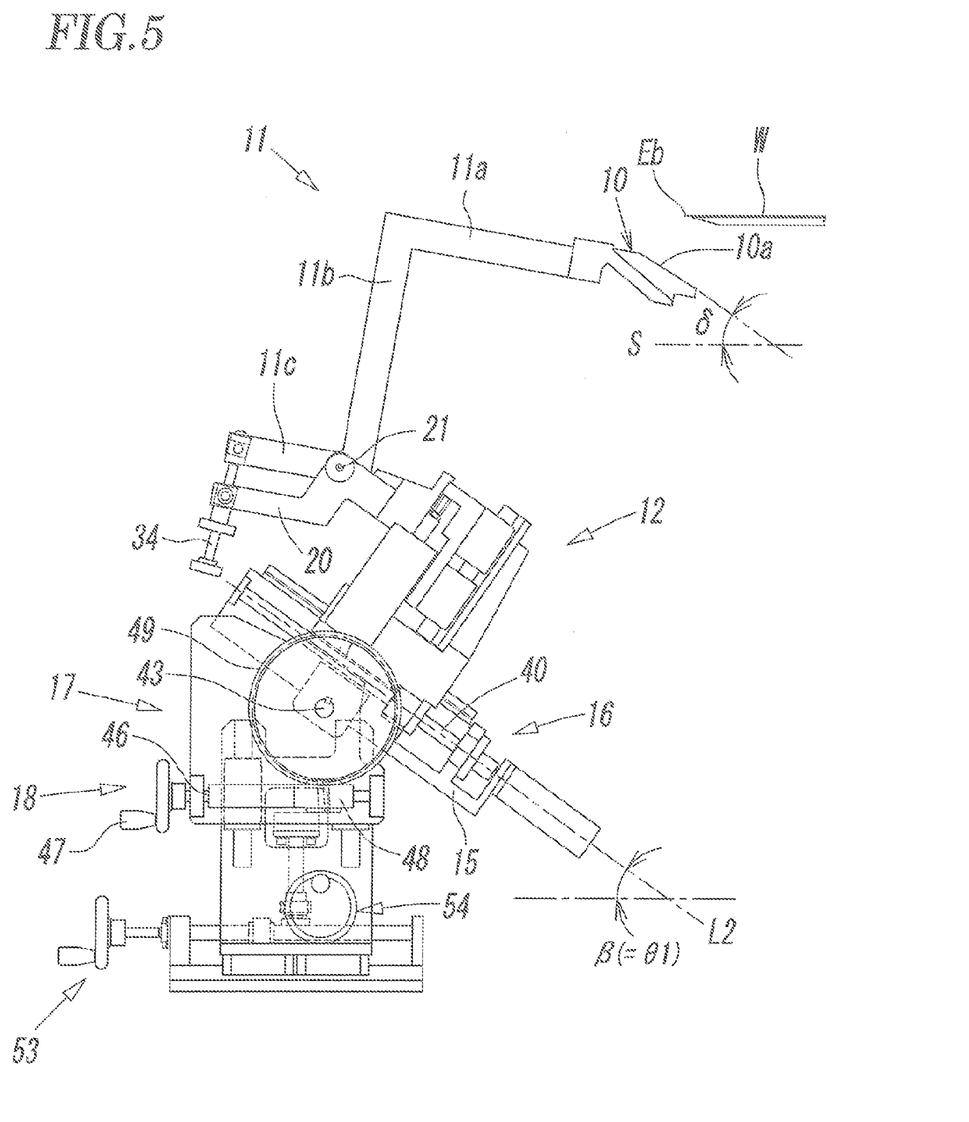
FIG. 5 is a side view of the rear surface edge polishing unit shown in FIG. 2, in an adjustment process of a reciprocation support base and a polishing member support unit for polishing a workpiece having a different bevel angle.
Figure 6:
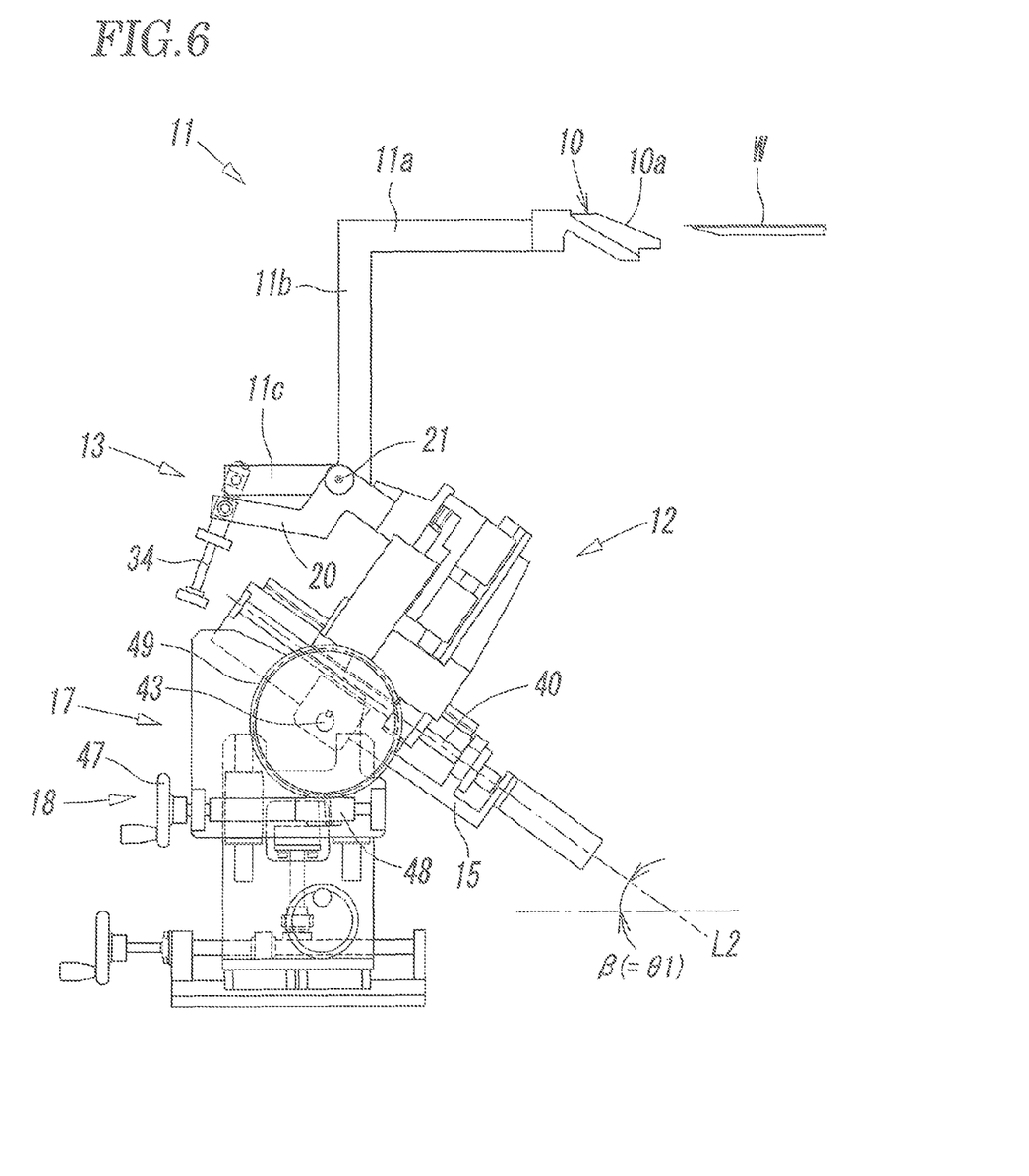
FIG. 6 is a side view of the rear surface edge polishing unit shown in FIG. 5 that has completed the adjustment process of the reciprocation support base and the polishing member support unit.

Upon adjusting the tilt angle $\beta$ of the reciprocation support base 15, the mounting structure support unit 12 and the polishing member mounting structure 11 are tilted about the second pivotal shaft 43 as a whole as shown in FIG. 5, and hence the transverse arm portion 11a of the polishing member mounting structure 11 loses horizontality and the working surface 10a of the polishing member 10 becomes nonparallel to the edge Eb of the workpiece W. For example, in the case where the bevel angle $\theta 1$ is larger than $\theta$, the mounting structure support unit 12 and the polishing member mounting structure 11 are made to pivot clockwise in FIG. 2 about the second pivotal shaft 43, and therefore the tilt angle $\delta$ of the working surface 10a with respect to the horizontal plane S becomes larger than $\theta 1$ as shown in FIG. 5. Accordingly, as shown in FIG. 6, the adjusting screw 34 of the mounting structure angle adjustment mechanism 13 is made to recede to cause the adjusting arm portion 11c to pivot about the first pivotal shaft 21 so as to make the gap between the adjusting arm portion 11c and the bracket 20 narrower, and thus the transverse arm portion 11a, hence the reference surface 10b of the polishing member 10 can be oriented horizontally. As a result, the tilt angle $\delta$ of the working surface 10a of the polishing member 10 becomes equal to $\theta 1$, and the working surface 10a becomes parallel to the edge Eb of the workpiece W.

Since the distance between the working surface 10a and the workpiece W is changed by the adjustment of the tilt angle $\beta$ of the reciprocation support base 15 and the tilt angle $\delta$ of the working surface 10a of the polishing member 10, the position in the horizontal direction and the position in the vertical direction have to be micro-adjusted by the horizontal position correction mechanism 53 and the vertical position correction mechanism 54, such that the working surface 10a is properly positioned for polishing the edge.

In the case where the bevel angle $\theta 1$ is smaller than $\theta$, the mounting structure support unit 12 and the polishing member mounting structure 11 are made to pivot opposite to the above, i.e., counterclockwise, about the second pivotal shaft 43 in FIG. 2, so that the tilt angle $\delta$ of the working surface 10a becomes smaller than $\theta 1$. Then the mounting structure angle adjustment mechanism 13 is operated in the opposite way to the above, so as to orient the transverse arm portion 11a, hence the reference surface 10b of the polishing member 10 in the horizontal direction.

Upon thus completing the adjustment of the tilt angle $\beta$ of the reciprocation line L2 to be equal to $\theta 1$ and the tilt angle $\delta$ of the working surface 10a of the polishing member 10 to be equal to $\theta 1$, the edge Eb can be polished by the same operation as described above for polishing the workpiece W having the bevel angle of $\theta$.

Here, when the foregoing angle adjustment is to be performed, the polishing member 10 may be moved away from the chucking device 1 by the horizontal position correction mechanism 53 and the vertical position correction mechanism 54, to facilitate the angle adjustment work.

For the edge Ea on the front surface of the workpiece W, the front surface edge polishing unit 2A is employed to perform the same operation as the operation performed by the rear surface edge polishing unit 2B to polish the edge Eb on the rear surface. The configuration and functions of the front surface edge polishing unit 2A are substantially the same as those of the rear surface edge polishing unit 2B except for some minor differences, for example in that the polishing member 10 is mounted on the polishing member mounting structure 11 in a posture suitable for polishing the edge Ea on the front surface of the workpiece W, in the extending direction and length of the adjusting arm portion 11c of the polishing member mounting structure 11 and the bracket 20 of the mounting structure support unit 12, in that the load applying device 14 is configured to apply the polishing load by downward displacement of the sliding member 30 caused by the receding motion of the rod 31a of the cylinder 31, in the location or orientation of the components constituting the base angle adjustment mechanism 18, and in the location or orientation of the components constituting the horizontal position correction mechanism 53 and the vertical position correction mechanism 54. Therefore, the essential constituents of the front surface edge polishing unit 2A are given the same numeral as those of the rear surface edge polishing unit 2B, and the description of such constituents will not be repeated.

REFERENCE SIGNS LIST

1 Chucking device
2A Front surface edge polishing unit
2B Rear surface edge polishing unit
10 Polishing member
10a Working surface
10b Reference surface
11 Polishing member mounting structure
12 Mounting structure support unit
13 Mounting structure angle adjustment mechanism
14 Load applying device
15 Reciprocation support base
16 Reciprocation mechanism
17 Base support unit
18 Base angle adjustment mechanism
19 Pedestal
21 First pivotal shaft
29 Reciprocation-slide base
30 Sliding member
43 Second pivotal shaft
51 First pedestal
52 Second pedestal
53 Horizontal position correction mechanism
54 Vertical position correction mechanism
W Workpiece
Ea Front surface edge
Eb Rear surface edge
L1 Axial line
L2 Reciprocation line
γ Working surface angle
β, δ Tilt angle
θ, θ1 Bevel angle

The invention claimed is:

1. An outer periphery polishing apparatus configured to polish a sloped edge formed on an outer periphery of a front surface and a rear surface of a disk-shaped workpiece, the outer periphery polishing apparatus comprising: a chucking device configured to retain the workpiece and rotate the workpiece about an axial line; and a front surface edge polishing unit and a rear surface edge polishing unit respectively configured to polish the edge of the front surface and the rear surface of the workpiece with an arcuate working surface of a polishing member, wherein the front surface edge polishing unit and the rear surface edge polishing unit each include a polishing member mounting structure to which the polishing member is replaceably attached; a mounting structure support unit that tiltably supports the polishing member mounting structure; a mounting structure angle adjustment mechanism that adjusts a tilt angle of the polishing member mounting structure such that the working surface of the polishing member becomes parallel to the edge of the workpiece; a load applying device that presses the working surface of the polishing member against the edge of the workpiece thereby applying a polishing load; a reciprocation support base that supports the mounting structure support unit so as to move along a straight line inclined with respect to the axial line; a reciprocation mechanism that causes the mounting structure support unit to reciprocate along the straight line, a base support unit that tiltably supports the reciprocation support base; a base angle adjustment mechanism that adjusts a tilt angle of the reciprocation support base such that the straight line becomes parallel to the edge of the workpiece; and a pedestal that supports the base support unit so as to allow positional correction in a vertical direction and a horizontal direction.

2. The outer periphery polishing apparatus according to claim 1, wherein the polishing member is formed such that a working surface angle defined by the working surface of the polishing member with respect to a reference surface becomes equal to a bevel angle of the workpiece, so that the working surface becomes parallel to the edge of the workpiece upon attaching the polishing member to the polishing member mounting structure and setting the reference surface to a horizontal orientation.

3. The outer periphery polishing apparatus according to claim 2, wherein the polishing member mounting structure is supported by the mounting structure support unit so as to tilt about a first pivotal shaft orthogonal to the axial line of the workpiece, and the reciprocation support base is supported by the base support unit so as to tilt about a second pivotal shaft parallel to the first pivotal shaft.

4. The outer periphery polishing apparatus according to claim 3, wherein the mounting structure support unit includes a reciprocation-slide base supported by the reciprocation support base so as to move along the straight line, and a sliding member supported by the reciprocation-slide base so as to move in a direction orthogonal to the straight line, and that the sliding member is connected to the load applying device and the polishing member mounting structure is supported by the sliding member.

5. The outer periphery polishing apparatus according to claim 4, wherein the pedestal includes a first pedestal located at a predetermined position, a second pedestal supported by the first pedestal so as to move in a horizontal direction and supporting the base support unit so as to move in a vertical direction, a horizontal position correction mechanism that corrects a position of the second pedestal in the horizontal direction, and a vertical position correction mechanism that corrects a position of the base support unit with respect to the second pedestal in the vertical direction.

6. The outer periphery polishing apparatus according to claim 3, wherein the pedestal includes a first pedestal located at a predetermined position, a second pedestal supported by the first pedestal so as to move in a horizontal direction and supporting the base support unit so as to move in a vertical direction, a horizontal position correction mechanism that corrects a position of the second pedestal in the horizontal direction, and a vertical position correction mechanism that corrects a position of the base support unit with respect to the second pedestal in the vertical direction.

7. The outer periphery polishing apparatus according to claim 2, wherein the pedestal includes a first pedestal located at a predetermined position, a second pedestal supported by the first pedestal so as to move in a horizontal direction and supporting the base support unit so as to move in a vertical direction, a horizontal position correction mechanism that corrects a position of the second pedestal in the horizontal direction, and a vertical position correction mechanism that corrects a position of the base support unit with respect to the second pedestal in the vertical direction.

8. The outer periphery polishing apparatus according to claim 1, wherein the polishing member mounting structure is supported by the mounting structure support unit so as to tilt about a first pivotal shaft orthogonal to the axial line of the workpiece, and the reciprocation support base is supported by the base support unit so as to tilt about a second pivotal shaft parallel to the first pivotal shaft.

9. The outer periphery polishing apparatus according to claim 8, wherein the mounting structure support unit includes a reciprocation-slide base supported by the reciprocation support base so as to move along the straight line, and a sliding member supported by the reciprocation-slide base so as to move in a direction orthogonal to the straight line, and that the sliding member is connected to the load applying device and the polishing member mounting structure is supported by the sliding member.

10. The outer periphery polishing apparatus according to claim 9, wherein the pedestal includes a first pedestal located at a predetermined position, a second pedestal supported by the first pedestal so as to move in a horizontal direction and supporting the base support unit so as to move in a vertical direction, a horizontal position correction mechanism that corrects a position of the second pedestal in the horizontal direction, and a vertical position correction mechanism that corrects a position of the base support unit with respect to the second pedestal in the vertical direction.

11. The outer periphery polishing apparatus according to claim 8, wherein the pedestal includes a first pedestal located at a predetermined position, a second pedestal supported by the first pedestal so as to move in a horizontal direction and supporting the base support unit so as to move in a vertical direction, a horizontal position correction mechanism that corrects a position of the second pedestal in the horizontal direction, and a vertical position correction mechanism that corrects a position of the base support unit with respect to the second pedestal in the vertical direction.

12. The outer periphery polishing apparatus according to claim 1, wherein the pedestal includes a first pedestal located at a predetermined position, a second pedestal supported by the first pedestal so as to move in a horizontal direction and supporting the base support unit so as to move in a vertical direction, a horizontal position correction mechanism that corrects a position of the second pedestal in the horizontal direction, and a vertical position correction mechanism that corrects a position of the base support unit with respect to the second pedestal in the vertical direction.

13. The outer periphery polishing apparatus according to claim 12, wherein the pedestal includes a first pedestal located at a predetermined position, a second pedestal supported by the first pedestal so as to move in a horizontal direction and supporting the base support unit so as to move in a vertical direction, a horizontal position correction mechanism that corrects a position of the second pedestal in the horizontal direction, and a vertical position correction mechanism that corrects a position of the base support unit with respect to the second pedestal in the vertical direction.

14. The outer periphery polishing apparatus according to claim 1, wherein the pedestal includes a first pedestal located at a predetermined position, a second pedestal supported by the first pedestal so as to move in a horizontal direction and supporting the base support unit so as to move in a vertical direction, a horizontal position correction mechanism that corrects a position of the second pedestal in the horizontal direction, and a vertical position correction mechanism that corrects a position of the base support unit with respect to the second pedestal in the vertical direction.

* * * * *